United States Patent
Deschene

[19]

[11] Patent Number: 6,044,010
[45] Date of Patent: Mar. 28, 2000

[54] FIVE TRANSISTOR SRAM CELL

[75] Inventor: Daniel J. Deschene, Morgan Hill, Calif.

[73] Assignee: National Semiconductor Corporation, Santa Clara, Calif.

[21] Appl. No.: 09/166,612

[22] Filed: Oct. 5, 1998

[51] Int. Cl.[7] .................................................. G11C 11/41
[52] U.S. Cl. ............... 365/154; 365/189.01; 365/189.05; 365/189.08
[58] Field of Search .................. 365/189.01, 189.05, 365/230.01, 189.08, 221, 190, 202, 154

[56] References Cited

U.S. PATENT DOCUMENTS

| | | | |
|---|---|---|---|
| 5,003,513 | 3/1991 | Porter et al. | 365/230.08 |
| 5,053,996 | 10/1991 | Slemmer | 365/156 |
| 5,386,379 | 1/1995 | Ali-Yahia et al. | 365/49 |
| 5,400,294 | 3/1995 | Srinivasan et al. | 365/230.06 |
| 5,583,821 | 12/1996 | Rose et al. | 365/226 |
| 5,633,828 | 5/1997 | McClure et al. | 365/201 |
| 5,691,935 | 11/1997 | Douglass | 365/149 |
| 5,764,900 | 8/1988 | Bader et al. | 365/189.01 |
| 5,850,359 | 12/1998 | Liu | 365/156 |
| 5,923,582 | 7/1999 | Voss | 365/154 |

*Primary Examiner*—Viet Q. Nguyen
*Attorney, Agent, or Firm*—Limbach & Limbach L.L.P.

[57] ABSTRACT

A five transistor static random-access-memory (SRAM) cell is disclosed. The cell includes two cross-coupled inverters, each having two transistors, and a single n-channel transistor switch. The cell is programmed by first forcing the node connected between the inverters and the switch to a predefined logic state that is maintained by a p-channel transistor of an inverter, and then passing the voltage that corresponds to the logic state to be programmed. If the logic state to be programmed matches the predefined logic state, no significant charge is transferred. If the logic state to be programmed does not match the predefined logic state, then the n-channel transistor switch overpowers the p-channel transistor to change the predefined logic state.

15 Claims, 2 Drawing Sheets

FIG. 3A    DS    
FIG. 3B    CS    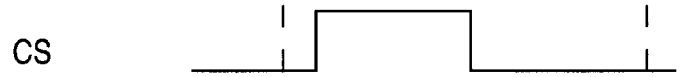
FIG. 3C    Node A    
FIG. 3D    Node B    
FIG. 3E    DATA I/O    
FIG. 4A    DS    
FIG. 4B    CS    
FIG. 4C    Node A    
FIG. 4D    Node B    
FIG. 4E    DATA I/O    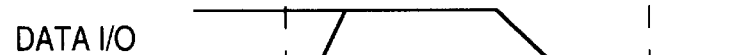

FIVE TRANSISTOR SRAM CELL

BACKGROUND OF THE INVENTION

1. Field of the Invention

The present invention relates to a static random-access-memory (SRAM) cell and, more particularly, to a five-transistor SRAM cell.

2. Description of the Related Art

A random-access-memory (RAM) cell is a semiconductor memory which stores information only as long as the power supplied to the memory cell remains uninterrupted. A static random-access-memory (SRAM) cell is a type of RAM cell that stores information in a flip-flop which is formed from a pair of cross-coupled inverters.

FIG. 1 shows a schematic diagram that illustrates a conventional SRAM cell 100. As shown in FIG. 1, cell 100 includes a flip-flop which is formed from a pair of inverters: a first inverter 110 and a second inverter 120.

First inverter 110, which includes a p-channel transistor P1 and a n-channel transistor N1, has an input connected to a node A, and an output connected to a node B. Second inverter 120, which includes a p-channel transistor P2 and a n-channel transistor N2, has an input connected to node B and an output connected to node A.

In addition, cell 100 also includes an input n-channel transistor N3 and an output n-channel transistor N4. As shown, transistor N3 is connected to an input node DATA IN, a write line WR, and node B, while transistor N4 is connected to an output node DATA OUT, a read line RD, and node A. Thus, a conventional SRAM cell requires six transistors.

In operation, data is written to cell 100 by placing either a low voltage for a logic zero or a high voltage for a logic one on the input node DATA IN. Transistor N3 is then turned on by pulsing write line WR with a high voltage.

For example, assume that cell 100 stores a logic one such that a low voltage (logic zero) is on node A and a high voltage (logic one) is on node B. The low voltage on node A turns on transistor P1 which drives a high voltage onto node B. The high voltage on node B, in turn, turns on transistor N2 which drives a low voltage onto node A.

If a logic zero is to be written to cell 100, the input node DATA IN is connected to a low voltage, such as ground, and transistor N3 is pulsed on. Turning on transistor N3 drives a low voltage onto node B which, in turn, pulls down the voltage on node B. Since transistor P1 is driving a high voltage onto node B, transistor N3 must be able to overpower transistor P1 and force a low voltage onto node B.

Once transistor N3 forces a low voltage onto node B, the low voltage turns off transistor N2 and turns on transistor P2 which drives the power supply voltage Vcc onto node A. The high voltage on node A turns off transistor P1 and turns on transistor N1, thereby driving a low voltage onto node B. The width of the pulse used to turn on transistor N3 is set to fall, and thereby turn off transistor N3, after transistor N1 has driven a low voltage onto node B, i.e., after the flop has flipped.

On the other hand, if a logic one is to be written to cell 100 (while a logic zero is on node A and a logic one is on node B), a high voltage is placed on input node DATA IN and transistor N3 is again pulsed on. In this case, however, no significant charge is transferred because a high voltage is already present on node B.

Similarly, assume that cell 100 stores a logic zero such that a high voltage (logic one) is on node A and a low voltage (logic zero) is on node B. The high voltage on node A turns on transistor N1 which drives a low voltage onto node B. The low voltage on node B, in turn, turns on transistor P2 which drives a high voltage onto node A.

If a logic zero is to be written to cell 100, the input node DATA IN is connected to ground and transistor N3 is pulsed on. As above, no significant charge is transferred because a low voltage is already present on node B.

On the other hand, if a logic one is to be written to cell 100, a high voltage, such as Vcc, is placed on input node DATA IN, and transistor N3 is turned on by pulsing write line WR with a high voltage. Turning on transistor N3 drives a high voltage onto node B which, in turn, pulls up the voltage on node B.

Since transistor N1 is driving a low voltage onto node B, transistor N3 must be able to overpower transistor N1 and force a high voltage onto node B. Once transistor N3 forces a high voltage onto node B, the high voltage turns off transistor P2 and turns on transistor N2 which, in turn, drives a low voltage onto node A.

The low voltage on node A turns off transistor N1 and turns on transistor P1, thereby driving a high voltage onto node B. As above, the width of the pulse used to turn on transistor N3 is set to fall, and thereby turn off transistor N3, after transistor P1 has driven a high voltage onto node B, i.e., after the flop has flipped.

Cell 100 is read by precharging output node DATA OUT to a high voltage, and then turning on transistor N4 by pulsing read line RD with a high voltage. If node A is high, no significant charge is transferred and cell 100 is read as having a logic zero. On the other hand, if node A is low, the output node DATA OUT is discharged through transistors N4 and N2, and cell 100 is read as having a logic one.

One of the problems with cell 100 is that, when compared to a dynamic random-access-memory (DRAM) cell which stores information as a charge on a capacitor, cell 100 consumes significantly more silicon real estate than a standard DRAM cell. Thus, there is a desire to reduce the size of a SRAM cell.

Another problem occurs when data is being written into cell 100. As noted above, when cell 100 stores a logic zero, transistor N1 is on and drives a low voltage onto node B to turn on transistor P2. To be able to write a logic one into cell 100, transistor N3 must be able to overpower transistor N1 so that transistor P2 will turn off and transistor N2 will turn on.

To overpower transistor N1, transistor N3 is typically formed to be larger than transistor N1. However, to minimize the silicon real estate consumed by cell 100, transistor N3 should not be made any larger than is necessary. (To help minimize the size of transistor N3, the trip point of inverter 120 (transistors P2/N2) is often lowered so that transistor P2 will turn off and transistor N2 will turn on when the voltage on node B is less than one-half the supply rail.)

Sizing transistor N3 to be able to overpower transistor N1 while at the same time minimizing the silicon real estate consumed by transistor N3 is not a trivial task because the charge transferred into node B via transistor N3 varies over time.

With a n-channel transistor, the overdrive of the transistor is defined as the gate-to-source voltage $V_{GS}$ minus the threshold voltage $V_{TH}$ ($V_{GS}-V_{TH}$). Thus, as the source voltage rises, the overdrive of the transistor declines.

With transistor N1, the source is connected to ground and, therefore, does not change. With transistor N3, however, the source is connected to node B and rises as the voltage on node B rises. As a result, the overdrive of transistor N3 decreases as the voltage on node B increases.

Thus, the charge transferred into node B varies over time. In addition to a rising source voltage, temperature and process variations can also effect the amount of charge that can be transferred to node B.

(Overpowering transistor P1, when transistor P1 is driving a high voltage onto node B, to write a logic zero into cell 100 is not a problem because a n-channel transistor can sink approximately twice the current that an equally-sized p-channel transistor can source.)

Thus, in addition to a smaller size, there is a need for a SRAM cell which eliminates the need for one n-channel transistor to overpower another n-channel transistor.

SUMMARY OF THE INVENTION

Conventionally, a static random-access-memory (SRAM) cell is implemented with six transistors. The present invention provides a SRAM cell that only requires five transistors: four transistors which are used to implement a pair of inverters, and a single transistor switch.

In accordance with the present invention, a semiconductor memory cell includes a first inverter which has an input and an output. In addition, the cell also includes a second inverter which has an input connected to the output of the first inverter, an input connected to a node, and an output connected to the input of the first inverter. Further, the cell also includes a switch which has an input, and an output that is connected to the input of the first inverter.

The cell is programmed by raising the voltage on the node for a predetermined time, and placing a voltage on the input of the switch which corresponds to a logic state to be programmed into the semiconductor memory. The switch is then turned on for a predefined time. The cell is read by placing a voltage on the input of the switch which corresponds to a logic state, and turning on the switch for a predefined time.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 3A–3E are timing diagrams illustrating the prewrite step and the write step for writing a zero into cell 200 in accordance with the present invention.

FIGS. 4A–4E are timing diagrams illustrating the steps for reading a logic zero from cell 200 in accordance with the present invention.

DETAILED DESCRIPTION

Figure 1:
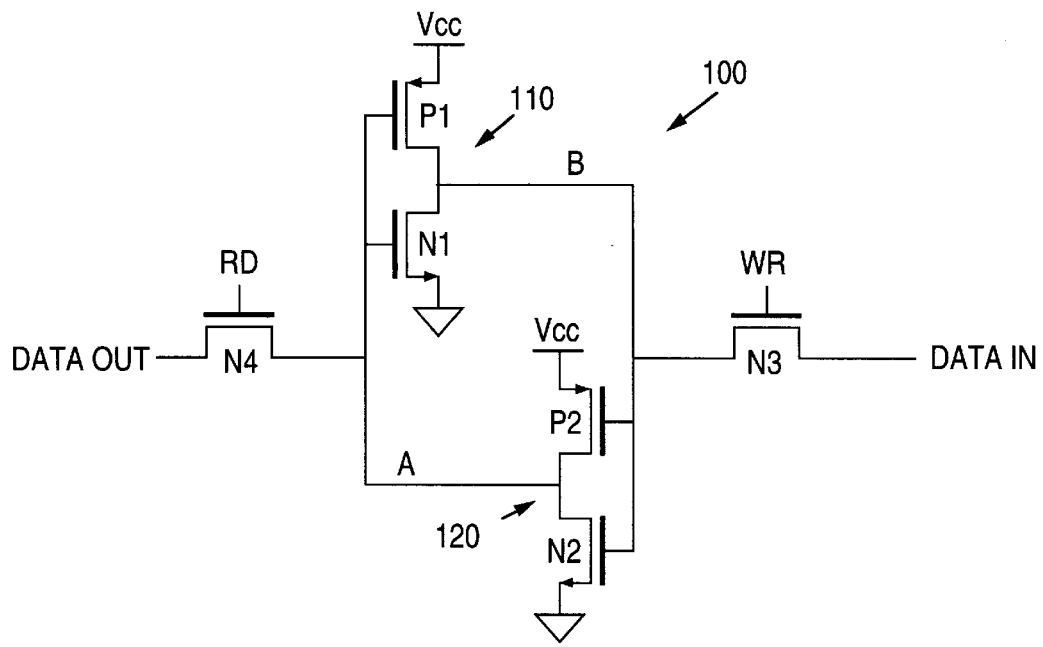
FIG. 1 is a schematic diagram illustrating a conventional SRAM cell 100.
Figure 2:
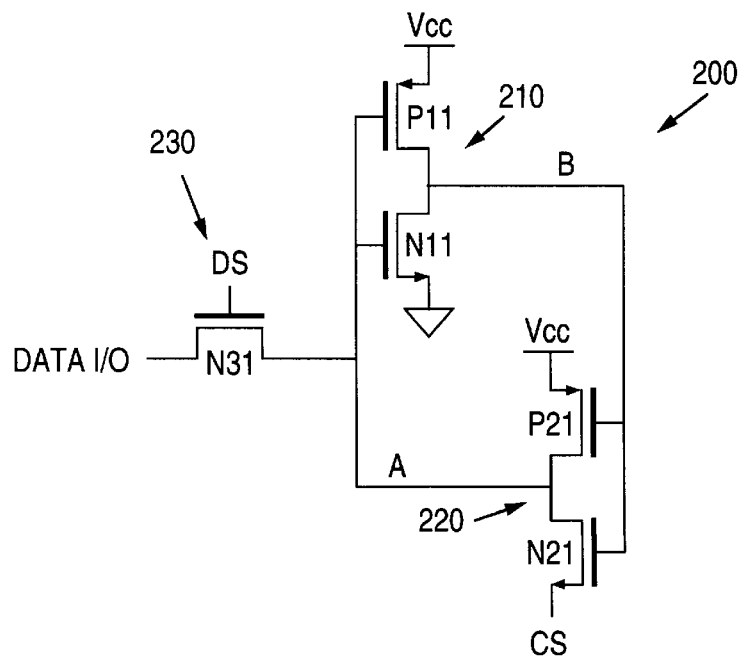
FIG. 2 is a schematic diagram illustrating a five transistor SRAM cell 200 in accordance with the present invention.

FIG. 2 shows a schematic diagram that illustrates a five transistor SRAM cell 200 in accordance with the present invention. As shown in FIG. 2, cell 200 includes a flip-flop which is formed from a pair of inverters: a first inverter 210 and a second inverter 220.

First inverter 210, which includes a p-channel transistor P11 and a n-channel transistor N11, has an input connected to a node A, and an output connected to a node B. Second inverter 220, which includes a p-channel transistor P21 and a n-channel transistor N21, has an input connected to node B, an input connected to a node CS, and an output connected to node A.

In addition, cell 200 also includes a switch 230 which is implemented with a n-channel transistor N31. As shown, transistor N31 is connected to an input/output node DATA I/O, an I/O line DS, and node A. Thus, in contrast to a conventional SRAM cell which requires six transistors, SRAM cell 200 of the present invention only requires five transistors.

In operation, cell 200 is written to or programmed in two steps: a prewrite step and a write step. FIGS. 3A–3E show timing diagrams that illustrate the prewrite step and the write step for writing a zero into cell 200 in accordance with the present invention.

As shown in FIGS. 3A–3E, in the prewrite step, node CS is pulsed to a high voltage, such as the power supply voltage Vcc, while transistor N31 remains off via I/O line DS remaining low. Raising the voltage on node CS causes the voltage on node A to rise.

Once the rising voltage on node A hits the trip point, transistor P11 turns off and transistor N11 turns on which, in turn, drives a low voltage onto node B. The low voltage on node B turns off transistor N21 and turns on transistor P21 which, in turn, drives a high voltage onto node A.

The trip point of inverter 210 may be lowered to insure that the high voltage passed by transistor N21 will cause transistor P11 to turn off and transistor N11 to turn on. (If cell 200 already has a high voltage on node A, no significant charge is transferred when the voltage on node CS is raised).

To write a logic zero, input/output node DATA I/O is driven to a low voltage, such as ground, at the beginning or during the prewrite step. The advantage of driving node DATA I/O at the beginning or during the prewrite step (on the rising edge or during the pulse applied to node CS) is that the device which drives node DATA I/O has more time to drive the voltage to a valid or final voltage. As a result of having more time, a smaller device can be used to drive node DATA I/O.

After the prewrite step, the voltage on node CS is lowered, and transistor N31 is turned on by pulsing I/O line DS with a high voltage. When transistor N31 is turned on, transistor N31 drives a low voltage onto node A which, in turn, pulls down the voltage on node A. Since transistor P21 is driving a high voltage onto node A, transistor N31 must be able to overpower transistor P21 and force a low voltage onto node A.

This is the only "fight" that must be guaranteed to be operational across process and temperature variations. However, since this is a n-channel transistor (N31) fighting a p-channel transistor (P21) to pull down the voltage on node A, this does not present a problem as a n-channel transistor can sink approximately twice the current that an equally-sized p-channel transistor can source.

Once transistor N31 forces a low voltage onto node A, the low voltage turns off transistor N11 and turns on transistor P11 which drives the power supply voltage Vcc onto node B. The high voltage on node B turns off transistor P21 and turns on transistor N21, thereby driving a low voltage onto node A. The width of the pulse used to turn on transistor N31 via line DS is set to fall, and thereby turn off transistor N31, after transistor N21 has driven a low voltage onto node A, i.e., after the flop has flipped.

On the other hand, if a logic one is to be written or programmed into cell 200, a high voltage is placed on input/output node DATA I/O at the beginning or during the prewrite step. In this case, no significant charge is transferred when transistor N31 is pulsed on via line DS because a high voltage is also present on node A as a result of the prewrite step.

FIGS. 4A–4E show timing diagrams that illustrate the steps for reading a logic zero from cell 200 in accordance with the present invention. As shown in FIGS. 4A–4E, prior to reading cell 200, input/output node DATA I/O is precharged to a high voltage. Following this, transistor N31 is turned on by pulsing I/O line DS.

Since transistor N21 is turned on when a logic zero is stored in cell 200, turning on transistor N31 allows the voltage on input/output node DATA I/O to be pulled low via transistors N31 and N21. The low voltage on input/output node DATA I/O is then read as a logic zero. (Transistor N21 must be made sufficiently strong so that transistor N21 can pull down the voltage passed from node DATA I/O to node A before the passed high voltage turns off transistor P11 and turns on transistor N11).

On the other hand, if a high voltage is on node A when a logic one is stored in cell 200, then no significant charge is transferred when transistor N31 is pulsed on since the precharged high-voltage on input/output node DATA I/O and the high voltage on node A are approximately the same. The high voltage on input/output node DATA I/O is then read as a logic one.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A semiconductor memory comprising:
   a first inverter having an input and an output;
   a second inverter having an input connected only to the output of the first inverter, and an output connected to the input of the first inverter; and
   a switch connected to the input of the first inverter.

2. The semiconductor memory of claim 1 wherein the first inverter includes:
   a p-channel transistor connected to a power node, the input of the first inverter, and the output of the first inverter; and
   a n-channel transistor connected to the input of the first inverter, the output of the first inverter, and ground.

3. The semiconductor memory of claim 1 wherein the second inverter includes:
   a p-channel transistor connected to a power node, the input of the second inverter, and the output of the second inverter; and
   a n-channel transistor connected to the input of the second inverter, the output of the second inverter, and an input node.

4. The semiconductor memory of claim 1 wherein the switch includes a transistor.

5. A method for programming a semiconductor memory, the memory having:
   a first inverter having an input and an output;
   a second inverter having an input connected to the output of the first inverter, an input connected to a node, and an output connected to the input of the first inverter; and
   a switch having an input, and an output connected to the input of the first inverter;
   the method comprising the steps of:
   raising the voltage on the node for a predetermined time;
   placing a voltage on the input of the switch which corresponds to a logic state to be programmed into the semiconductor memory; and
   turning on the switch for a predefined time.

6. The method of claim 5 wherein the switch is turned on after the predetermined time has expired.

7. A method for programming a semiconductor memory, the memory having:
   a first node;
   a second node;
   a third node;
   a fourth node;
   a first inverter having an input connected to the first node, and an output connected to the second node;
   a second inverter having an input connected to the second node, an output connected to the first node, and an input connected to a third node; and
   a switch having an input connected to the fourth node, and an output connected to the first node;
   the method comprising the steps of:
   setting a first voltage on the first node and a second voltage on the second node;
   placing a voltage on the fourth node which corresponds to a logic state to be programmed into the semiconductor memory; and
   turning on the switch for a predefined time.

8. The method of claim 7 wherein the setting a first voltage step includes the step of raising the voltage on the third node for a predetermined time.

9. The method of claim 8 wherein the switch is turned on after the predetermined time has expired.

10. A method for reading a semiconductor memory, the memory having:
    a first inverter having an input and an output;
    a second inverter having an input connected only to the output of the first inverter, and an output connected to the input of the first inverter; and
    a switch having an input and an output connected to the input of the first inverter;
    the method comprising the steps of:
    placing a voltage on the input of the switch which corresponds to a logic state; and
    turning on the switch for a predefined time.

11. A method for programming a semiconductor memory, the memory having:
    a first node;
    a second node;
    a third node;
    a first inverter having an input connected to the first node, and an output connected to the second node;
    a second inverter having a first input connected to the second node, an output connected to the first node, and a second input connected to a third node; and
    a switch having an input, and an output connected to the first node;
    the method comprising the steps of:
    placing a high voltage on the third node for a first predefined time, the high voltage on the third node causing a high voltage to be on the first node when the first node has a low voltage, the high voltage on the first node caused by placing the high voltage on the third node being sufficient to cause the first inverter to output a low voltage, the first predefined time being sufficient to allow the high voltage on the first node, caused by placing the high voltage on the third node, to cause the first inverter to output the low voltage and the second inverter to output a high voltage in response to the low voltage output by the first inverter;

placing a voltage on the input of the switch which corresponds to a logic state to be programmed into the semiconductor memory; and turning on the switch for a second predefined time, the second predefined time being sufficient so that, after the high voltage is removed from the third node, the voltage on the input of the switch causes the first inverter to output a high voltage when the voltage on the input of the switch is a low voltage.

12. The method of claim 11 wherein the first predefined time is defined by a signal having a leading edge and a trailing edge, wherein the second predefined time is defined by a signal having a leading edge and a trailing edge, and wherein the trailing edge of the signal that defines the first predefined time coincides with the leading edge of the signal that defines the second predefined time.

13. The method of claim 11 wherein the voltage placed on the input of the switch is placed on the input of the switch prior to the trailing edge of the signal that defines the first predefined time.

14. The method of claim 11 wherein the second inverter includes:

a p-channel transistor having a source connected to a power node, a drain connected to the first node, and a gate connected to the second node; and a n-channel transistor having a source connected to the third node, a drain connected to the drain of the p-channel transistor, and a gate connected to the gate of the p-channel transistor.

15. The method of claim 11 and further comprising the reading steps of:

placing a high voltage on the input of the switch; and turning on the switch for a third predefined time, the third predefined time being sufficient to allow the high voltage on the input of the switch to fall to a low voltage when a low voltage is on the first node.

* * * * *